(12) United States Patent
McInerney et al.

(10) Patent No.: US 6,319,553 B1
(45) Date of Patent: Nov. 20, 2001

(54) ISOLATION OF INCOMPATIBLE PROCESSES IN A MULTI-STATION PROCESSING CHAMBER

(75) Inventors: Edward J. McInerney; Thomas M. Pratt, both of San Jose; Shawn D. Hancock, Alviso, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/514,469

(22) Filed: Feb. 28, 2000

Related U.S. Application Data

(62) Division of application No. 09/169,624, filed on Oct. 8, 1998, now Pat. No. 6,143,082.

(51) Int. Cl.$^7$ .................................................. C23C 16/00
(52) U.S. Cl. ........................ 427/250; 118/719; 118/730; 427/255.5; 427/255.7; 427/294; 427/301; 427/337
(58) Field of Search ..................................... 118/719, 730; 427/250, 255.5, 255.7, 294, 301, 337

(56) References Cited

U.S. PATENT DOCUMENTS

| | | | |
|---|---|---|---|
| 5,133,284 | 7/1992 | Thomas et al. | 118/719 |
| 5,230,741 | 7/1993 | van de Ven et al. | 118/728 |
| 5,238,499 | 8/1993 | van de Ven et al. | 118/724 |
| 5,302,209 | 4/1994 | Maeda et al. | 118/719 |
| 5,338,362 | 8/1994 | Imahashi | 118/719 |
| 5,779,803 | 7/1998 | Kurono et al. | 118/723 E |
| 6,143,082 | 11/2000 | McInerney et al. | |

OTHER PUBLICATIONS

E.J. McInerney, "Study of station flow dynamics in a sequential multiwafer chemical vapor deposition batch reactor using reactor modeling", J. Vac. Sci. Technol. A 14(3), May/Jun. 1996, 1996 American Vacuum Society, pp. 1152–1155.

*Primary Examiner*—Bernard Pianalto
(74) *Attorney, Agent, or Firm*—Skjerven Morrill MacPherson LLP; David E. Steuber; Michael J. Halbert

(57) ABSTRACT

A multi-station processing chamber in which incompatible processes are performed includes multiple pedestals positioned in wells with annular gaps around the pedestals. Showerheads located above the pedestals flow reactive gases over substrates located on the pedestals. The reactive gases are drawn through the annular gaps by a pressure gradient. The reactive gases are then pumped out of the wells through an exhaust port. The narrow annular gap permits little recirculation of the reactive gases one they are drawn into the wells. Moreover, the showerheads are flush with ceiling of the chamber and the wells contain smooth contours to minimize dead space in the chamber thereby reducing residence time of the reactive gases. An indexing plate is used to lift the substrates off the pedestals and to accurately position the substrates at the next processing station. In one embodiment a purge plate located on the ceiling of the chamber between the showerheads flows an inert gas, such as argon, to further assist in maintaining a separation between the reactive gases. Thus, while one process, such as a silane initiation is performed at one station, other stations may contemporaneously perform an incompatible process, such as a tungsten hexafluoride-silane nucleation process and hydrogen reduction, thereby increasing throughput.

13 Claims, 10 Drawing Sheets

ISOLATION OF INCOMPATIBLE PROCESSES IN A MULTI-STATION PROCESSING CHAMBER

This application is a divisional of application No. 09/168,624 filed Oct. 8, 1998, now U.S. Pat. No. 6,143,082, issued Nov. 7, 2000, intitled "Isolation Of Incompatible Processes In A Multi-Station Processing Chamber".

FIELD OF THE INVENTION

The present invention relates to processing chambers and in particular the present invention relates to a multi-station processing chamber.

BACKGROUND

Multi-station processing chambers are used to process several substrates, such as semiconductor wafers, within the same chamber. By processing several wafers at once, the throughput of the system is increased. An example of a multi-station processing chamber is the batch chemical vapor deposition ("CVD") chamber, Concept 2 Altus model, manufactured by Novellus Systems, Inc. located in San Jose, Calif.

While the throughput of multi-station processing chambers is typically greater than single wafer processing chambers, the throughput of a multi-station processing chamber is generally limited by the inability to simultaneously perform incompatible processes. For example, in a CVD tungsten chamber, incompatible reactive gases, such as silane ($SiH_4$) and tungsten hexafluoride ($WF_6$) are used within the same chamber. If these reactive gases are permitted to mix at critical $SiH_4$ to $WF_6$ ratios, particles may be formed in the gas phase, which then may contaminate the wafers being processed. In conventional CVD tungsten chambers, each wafer introduced to the chamber must be brought up to temperature and exposed to silane gas in an initiation step. If the silane gas is exposed to any tungsten hexafluoride during the initiation step, unwanted particles will form. Thus, the tungsten deposition at other stations can occur only after the newly introduced wafer has completed its heating and silane initiation step.

In addition, where reactive gases, e.g., tungsten hexafluoride, migrate from one area in the chamber to other areas in an uncontrolled fashion prior to the completion of other processing steps, such as the silane initiation, the reactive gases may attack the Ti seed/barrier layers causing damage to the devices on the wafers. This mechanism can be independent of the gas phase particle producing phenomena. Thus, during the heating and silane initiation of the wafer, the other stations in the multi-station chamber must remain idle to avoid the uncontrolled migration of reactive gases or the undesirable combination of reactive gases. Consequently, the throughput of a multi-station processing chamber is limited by the idle period of the different stations while incompatible processes are performed in neighboring stations. Alternatively, a multi-station processing chamber must perform certain incompatible processing steps, such as the silane initiation, in a separate reactor, which adds cost and complexity to the system, and may reduce throughput.

SUMMARY

A multi-station processing chamber, in which incompatible processes can be performed simultaneously, includes a base with a plurality of wells in which pedestals are located. The outside edge of the wells and the pedestals define annular gaps. The chamber also includes a top portion with showerheads that are aligned above each of the plurality of pedestals. The showerheads flow reactive gases over substrates, such as semiconductor wafers, that are located on the pedestals. The reactive gases are drawn through the annular gap by a pressure gradient created by a vacuum pump connected to the wells via exhaust ports. The reactive gases are thus drawn through the annular gaps into the wells and out the exhaust port. The narrow annular gaps permit little or no recirculation of the reactive gases once the gases are drawn into the wells. Consequently, the reactive gases are not permitted to mix in an uncontrolled manner at an elevated temperature and pressure sufficient to cause a gas phase reaction, thereby avoiding unintentional creation of gas phase particles. Further, the undesirable migration of reactive gases throughout the chamber is avoided.

The showerheads are flush with the ceiling of the chamber, while the wells contain smooth contours to limit the dead space in the chamber, thereby minimizing residence time of the reactive gases.

The chamber also includes an indexing plate to move the substrates from one station to the next. The substrates are loaded and unloaded via a load/unload port adjacent to one station.

In one embodiment, a purge plate that flows an inert gas, such-as argon, is located between the showerheads on the ceiling of the chamber. The flow of an inert gas between the flow of reactive gases assists in maintaining the desired separation of reactive gases.

Using the chamber in accordance with an embodiment of the present invention, incompatible processes may be contemporaneously performed. Thus, a substrate positioned on one pedestal at one station may receive a silane initiation, while another substrate positioned on another pedestal can simultaneously receive a tungsten hexafluoride-silane nucleation or hydrogen reduction. Because each process step may be performed at the same time, there is little or no idle period, thereby increasing throughput.

BRIEF DESCRIPTION OF THE DRAWINGS

The above and other features, aspects, and advantages of the present invention will become better understood with regard to the following description, appended claims, and accompanying figures, where:

DETAILED DESCRIPTION

Figure 1:
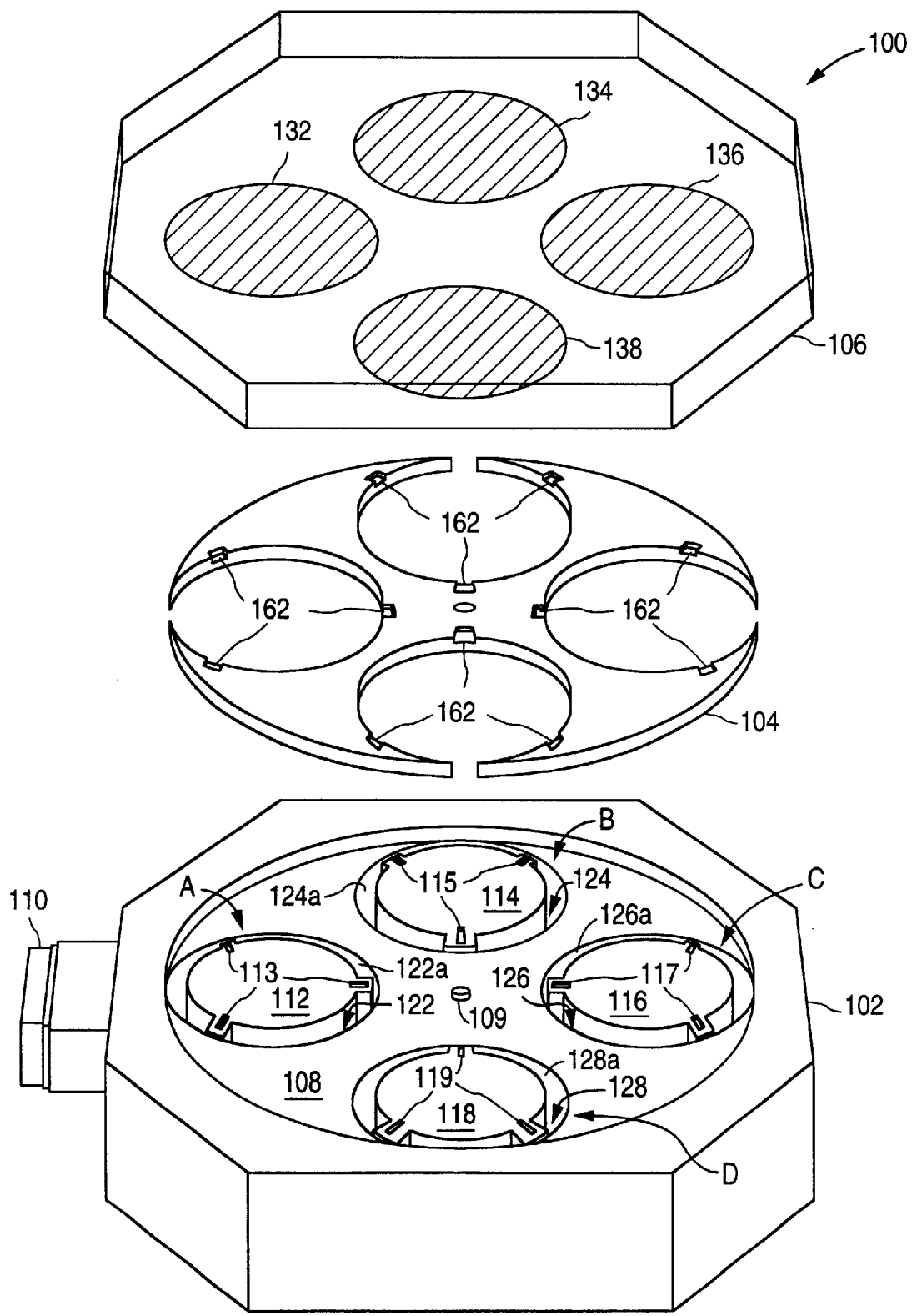
FIG. 1 is an exploded perspective view of a multi-station processing chamber, in which incompatible processes can be simultaneously performed on multiple substrates.

FIG. 1 is an exploded perspective view of a multi-station processing chamber 100, in which incompatible processes can be simultaneously performed on multiple substrates, such as semiconductor wafers, flat panel displays, glass plates or disks or any other device, in accordance with an embodiment of the present invention. The present disclosure will refer to the substrates as semiconductor wafers. Chamber 100 includes a chamber base 102, a wafer indexing plate 104 and a chamber top 106.

Figure 2:
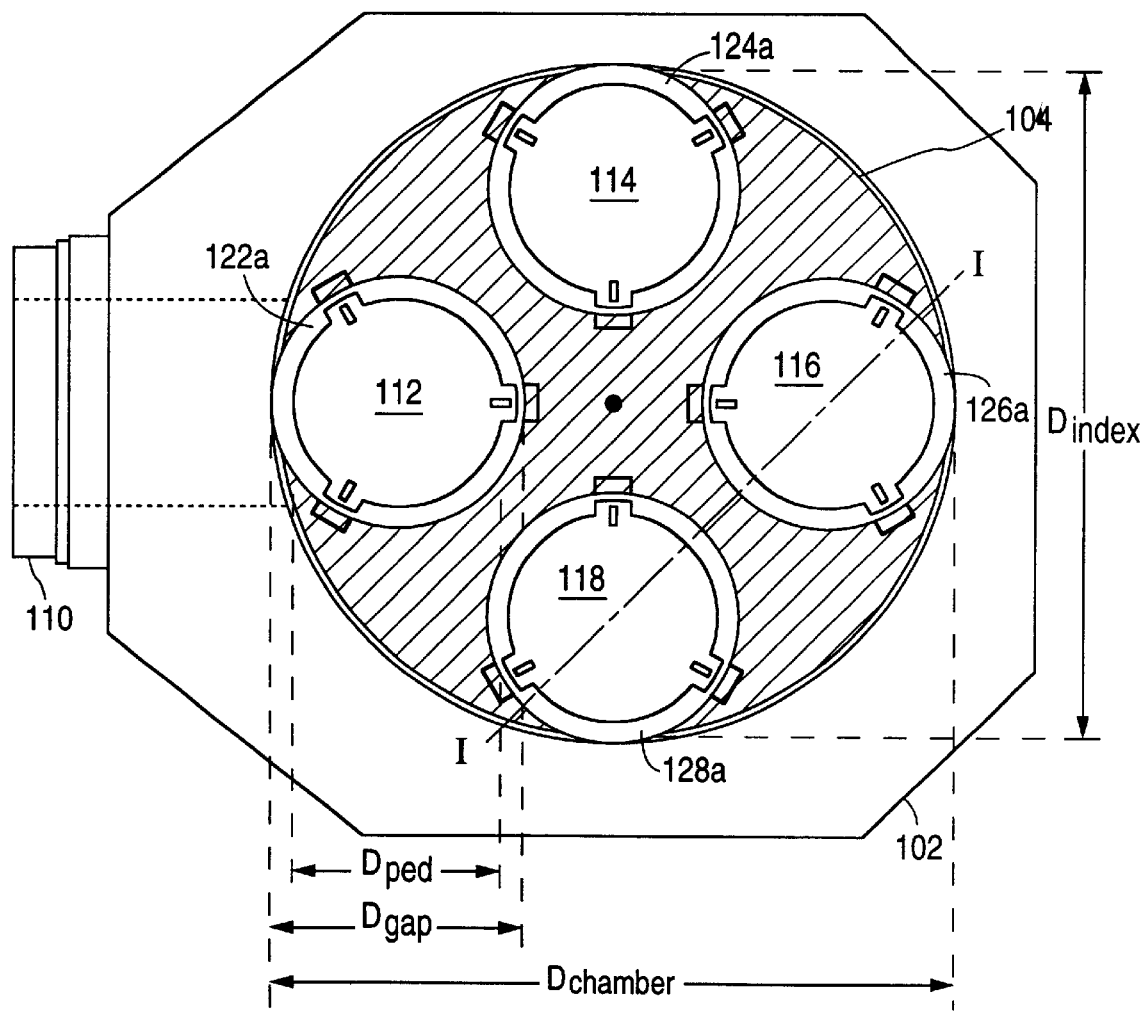
FIG. 2 shows a plan view of the chamber including the chamber base and the wafer indexing plate.

FIG. 2 shows a plan view of chamber base 102 with wafer indexing plate 104. Chamber top 106 is not shown in FIG. 2 for clarity.

One example of an embodiment of chamber 100 is the Concept 3 Altus processing chamber manufactured by Novellus Systems, Inc., located in San Jose, Calif. It will be understood that although four pedestals and stations are shown in chamber 100 in FIGS. 1 and 2, this number is illustrative. Thus, there is no limitation as to the specific number of pedestals used, only that a plurality of pedestals and stations are used.

As shown in FIG. 1, chamber base 102 includes four pedestals 112, 114, 116, and 118 each positioned within a corresponding well 122, 124, 126, 128. Chamber top 106 includes four showerheads 132, 134, 136, and 138 that are aligned with respective pedestals 112, 114, 116, 118. It should be understood that showerheads 132 134, 136, and 138 are on the interior wall of chamber top 106, i.e., on the ceiling of chamber 100, but are explicitly shown on chamber top 106 for the sake of clarity. Each combination of pedestal, well, and showerhead forms an individual processing station within chamber 100. Thus, the combination of pedestal 112, well 122, and showerhead 132 forms station A, the combination of pedestal 114, well 124, and showerhead 134 forms station B, the combination of pedestal 116, well 126, and showerhead 136 forms station C, and the combination of pedestal 118, well 128, and showerhead 138 forms station D. Each station is isolated from the other stations in chamber 100 through the efficient use of gas flow in accordance with one embodiment of the present invention. Chamber base 102 also includes a wafer load/unload port 110 adjacent to station A, which is used to load and unload wafers into processing chamber 100.

Where chamber 100 is configured to process 300 mm semiconductor wafers, the inside diameter $D_{chamber}$ of chamber 100, as shown in FIG. 2, is approximately 41 inches. The diameter $D_{ped}$ of each pedestal is approximately 14 inches.

Showerheads 132, 134, 136, and 138 are used to distribute the reactive gases uniformly over the wafer bearing surfaces of respective pedestals 112, 114, 116, and 118, where wafers are positioned during processing. The showerheads are, for example, plates of aluminum or other similarly rigid, non-corrosive material, having small holes through which the reactive gases flow. For example, each of showerheads 132, 134, 136, and 138 is 14 inches in diameter and contains approximately 3355 uniformly distributed holes, where each hole is approximately 0.04 inches in diameter. Of course, the particular type of material used for the showerheads, as well as the other parts of chamber 100, is dependent upon the specific type of processing for which chamber 100 is intended, as will be understood by those of ordinary skill in the art. Each showerhead is connected to a gas supply (shown in FIG. 3) of the particular gases that is distributed by that showerhead. The supply of gas to each showerhead is strictly controlled by a single or multiple mass flow controllers (electro-mechanical devices used to precisely meter gas flow), which in turn are controlled by a microprocessor, digital signal processor or any other appropriate manner (also shown FIG. 3).

During processing, semiconductor wafers are moved from one pedestal to the next by wafer indexing plate 104, such that each wafer is sequentially moved through and processed in each station of chamber 100. Wafer indexing plate 104 may be manufactured from any rigid, non-corrosive material such as aluminum. The outside diameter $D_{index}$ of wafer indexing plate 104, shown in FIG. 2, is approximately 40 inches. Wafer indexing plate 104 is shown cross hatched in FIG. 2 for the sake of clarity.

Wafer indexing plate 104 rests on the top surface 108 of chamber base 102, when wafers are being processed. A spindle 109 projects from top surface 108 of chamber base 102 and is used to lift wafer indexing plate 104 and rotate wafer indexing plate 104 in a clockwise direction when the wafers in chamber 100 are to be moved to the next processing station. Wafer indexing plate 104, the rim of top surface 108 around each well, and each pedestal define an annular gap that serves as an opening into each well. Thus, each well 122, 124, 126, and 128 includes a respective annular gap 122a, 124a, 126a, and 128a. Wafer indexing plate 104 includes a plurality of notches 162, which are used to lift a minimum overlap exclusion ring ("MOER" ring) (shown in FIGS. 5, 6, and 7) and the wafer during indexing.

Each pedestal 112, 114, 116, and 118 includes a plurality of mounting blocks 113, 115, 117, and 119 with small grooves, to assist in aligning wafer indexing plate 104 and lifting the wafers off the pedestals, as will be discussed below in reference to FIGS. 8A and 8B. The diameter $D_{gap}$ of the annular gaps, is approximately 15 inches, which is the same as the diameter of the holes in wafer indexing plate 104.

Figure 3:
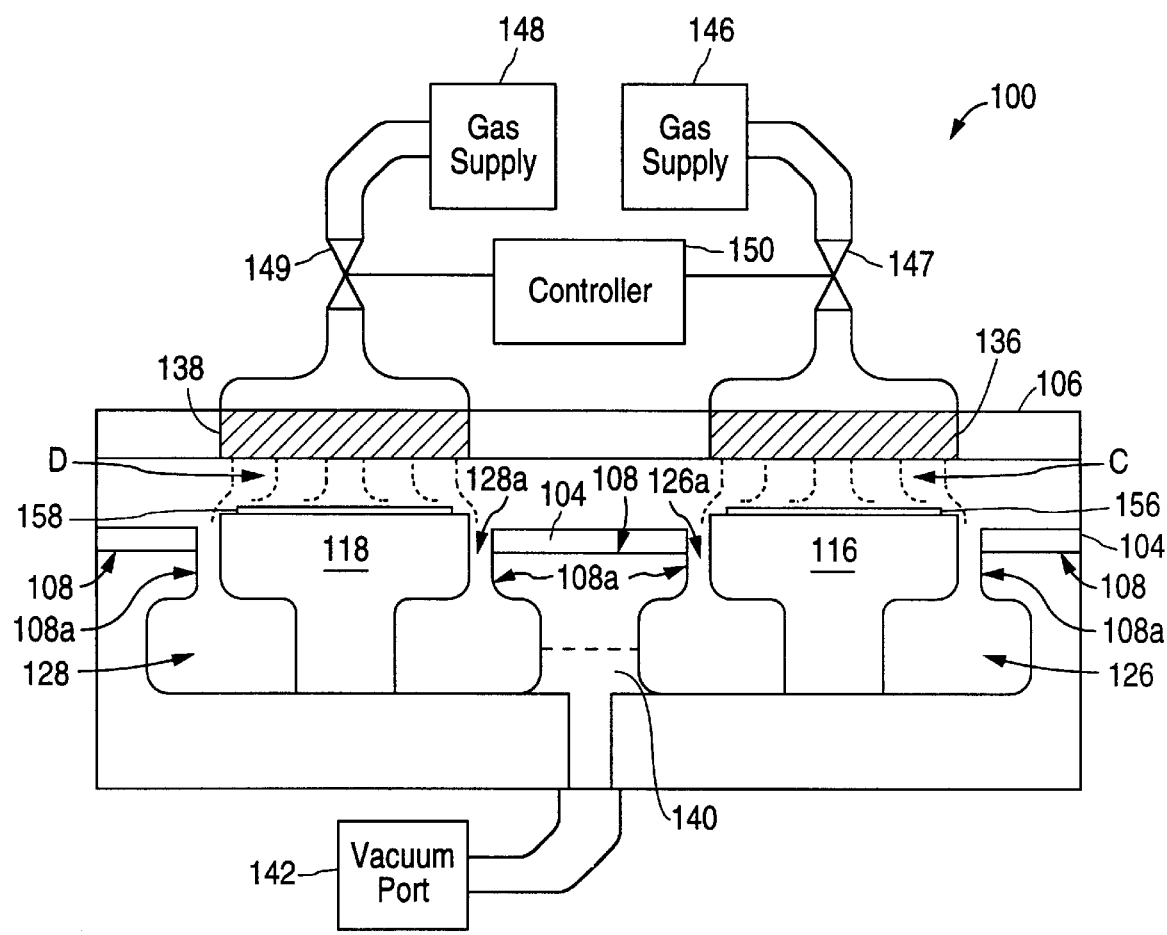
FIG. 3 is a cross-sectional view of the chamber showing a side view of two stations, including the chamber base, wafer indexing plate, and chamber top.

FIG. 3 is a cross-sectional view of chamber 100 along line I—I, as shown in FIG. 2, including chamber base 102, wafer indexing plate 104, and chamber top 106. FIG. 3 shows a side view of pedestals 118 and 116 along with wells 128, 126, and showerheads 138, 136, all of which form respective stations D and C. Also shown in FIG. 3 are annular gaps 128a and 126a defined by wafer indexing plate 104, the rim 108a of top surface 108 and respective pedestals 118 and 116. As shown in FIG. 3, the base of wells 126 and 128 is wider than the width of annular gaps 126a and 128a. The diameter of the wells at their base is approximately 17 inches. Showerheads 136 and 138 are approximately 1 inch above the wafer bearing surfaces of pedestals 116 and 118. The extensions 113, 115, 117, and 119 of pedestals 112, 114, 116, and 118 are not shown in FIG. 3 for the sake of clarity.

FIG. 3 also shows an exhaust port 140 located at the bottom of and is fluidically coupled to well 126 and well 128. Exhaust port 140 is connected to a vacuum pump 142. Each well in chamber 100 is connected to the wells on either side by an exhaust port, which is then connected to vacuum pump 142. Thus, for example, well 128 is also connected to well 122 by an exhaust port, not shown in FIG. 3, and well 116 is connected to well 124 by an exhaust port, also not shown in FIG. 3. Of course, if desired, each well may have a separate exhaust port that is independently connected to vacuum pump 142 or to separate vacuum pumps.

In addition, as shown in FIG. 3, showerheads 136 and 138 are connected to separate gas supplies 146 and 148 via respective valves 147 and 149. The supply of gas to showerheads 136 and 138 is controlled by a controller 150, such as a mass flow controller which is controlled by a microprocessor, a digital signal processor or the like, that is programmed with the flow rates, duration of the flow, and the sequencing of the processes. Wafer indexing plate 104 is controlled by a system controller that schedules timing throughout the system, and which may be a separate or the same microprocessor, digital signal processor, or the like used in controller 150. Showerheads 136 and 138 may be connected to the same gas supply, independent gas supplies and/or multiple gas supplies if desired. Thus, several different gases can be independently controlled to flow through each showerhead. It should be understood that the other showerheads in chamber 100, i.e., showerheads 132 and 134 are similarly connected to gas supplies and controller 150.

During processing, semiconductor wafers 156 and 158, shown in FIG. 3, are positioned on the wafer bearing surfaces of respective pedestals 116 and 118. Controller 150 opens valves 147 and 149 permitting gas to flow through showerheads 136 and 138, as indicated by the dotted lines, while vacuum pump 142 pumps gas out of wells 126 and 128. A pressure gradient is formed within chamber 100, with the highest pressure existing below showerheads 136 and 138 and above pedestals 116 and 118 and the lowest pressure at exhaust port 140 and in wells 126 and 128. Because the gas flows from highest to lowest pressure, the gas is directed through annular gaps 126a and 128a and into wells 126 and 128. The presence of annular gaps 126a and 128a assures a gas flow geometry that isolates each station, i.e., station C from station D and prevents recirculation of the gases within chamber 100.

Thus, reactive gases from showerheads 136 and 138 react on the surfaces of respective wafers 156 and 158 and then are drawn down into respective wells 126 and 128, via annular gaps 126a and 128a, and have little opportunity to migrate toward another pedestal. Any gas that does migrate toward another pedestal will become entrained in the gas flow surrounding that pedestal and will be drawn down into that pedestal's well rather than reaching the pedestal. Once gas is drawn into a well, the gas will be pumped out through exhaust port 140 and will not recirculate back up through annular gaps 126a and 128a. To aid in the uniform flow of gas through wells 126 and 128 (without any recirculation zones), the walls of chamber 100, including the wells, should have no sharp angles. Additionally, showerheads should be flush with the bottom surface of chamber top 106, i.e., the ceiling of chamber 100, to minimize dead space in chamber 100, which will limit the residence time of reactive gases and thus further inhibit opportunities for flow stagnation/recirculation to form.

It should be understood that the other stations of chamber 100, i.e., stations A and B, have similar cross sections to stations C and D shown in FIG. 3. Thus, the flow of gas in the other stations in chamber 100 has a flow geometry similar to that explained in FIG. 3.

Figure 4:
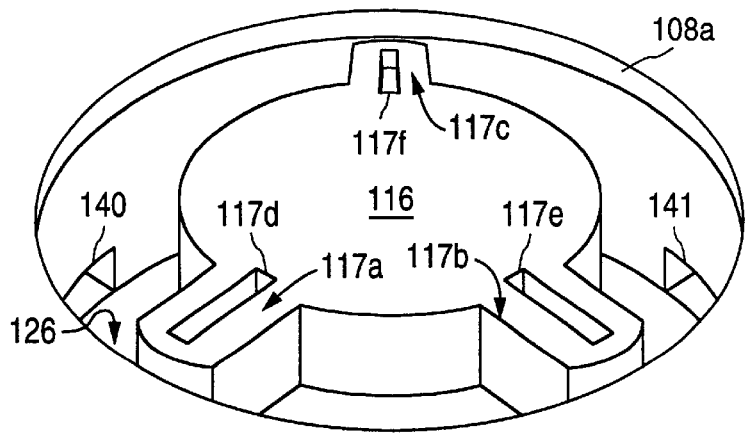
FIG. 4 shows a perspective view of a pedestal in a well.

FIG. 4 shows a detailed perspective view of pedestal 116 in well 126. Also shown in FIG. 4 is exhaust port 140 along with a second exhaust port 141, which connects well 126 with well 124. Rim 108a of top surface 108 is also shown. As shown in FIG. 4, pedestal 116 includes three mounting blocks 117a, 117b, and 117c, each with a groove 117d, 117e, and 117f, respectively. Grooves, 117d, 117e, and 117f are used to accurately position the wafers during indexing, as explained below. Each pedestal in chamber 100 has a similar configuration of mounting blocks and grooves as that shown in FIG. 4.

Wafer 156 may be positioned on pedestal 116 by itself or in conjunction with MOER ring 157. Each wafer is inserted into a MOER ring as the wafer is loaded into chamber 100. MOER rings are rings of a non-corrosive material, such as ceramic or aluminum with an inside diameter that is approximately the same as the wafer being inserted. Thus, exposure of the outside diameters of the wafers inserted into an MOER rings is minimized during processing.

Figure 5:
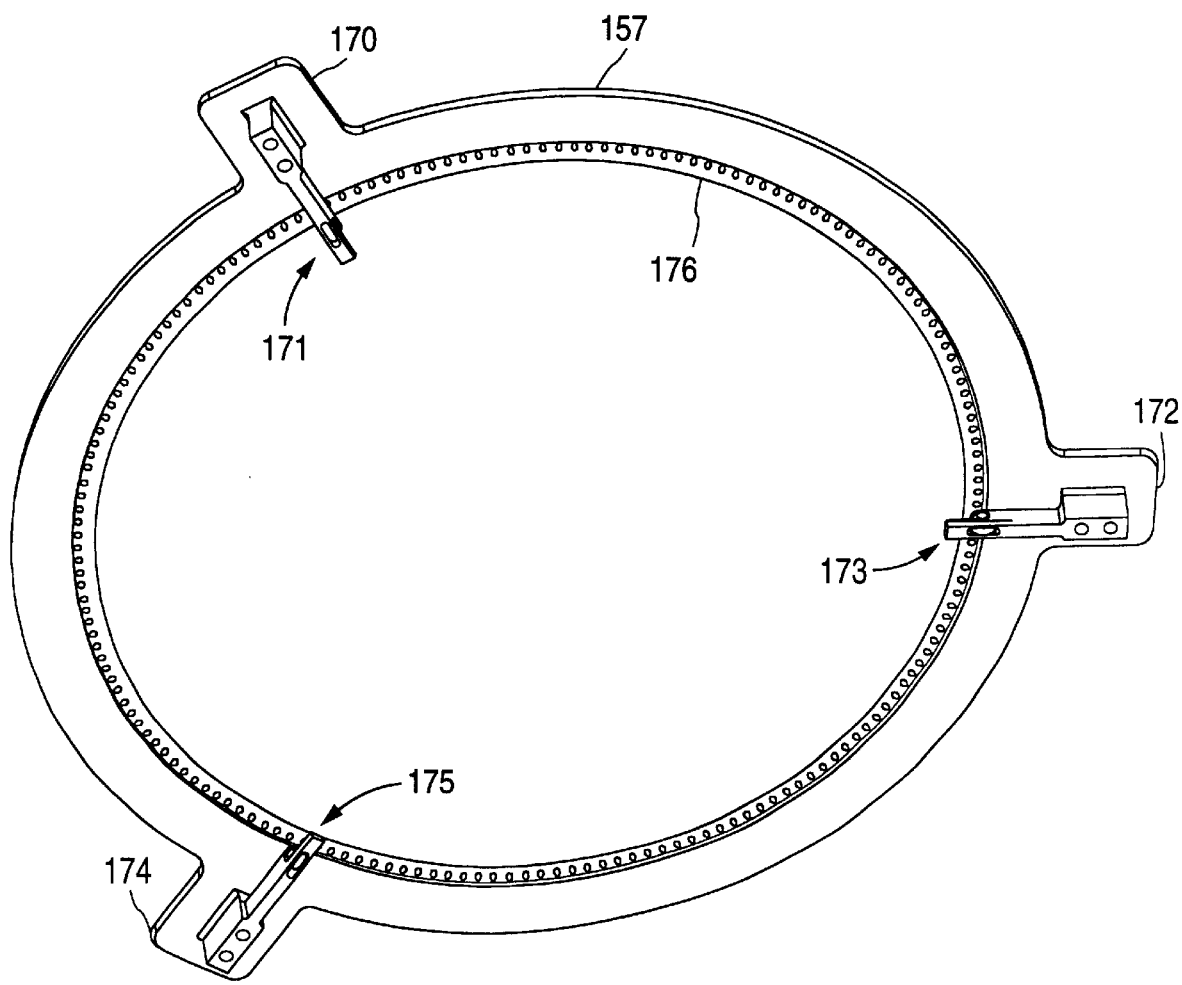
FIG. 5 is a bottom perspective view of MOER ring that may be used in conjunction with the present invention.

FIG. 5 is a bottom perspective view of MOER ring 157. As can be seen in FIG. 5, MOER ring 157 includes a plurality of tongues 170, 172, and 174, each having a respective holder assembly 171, 173, and 175. Holder assemblies 171, 173, and 175 are used to lift the wafer when MOER ring 157 is lifted by wafer indexing plate 104. Bearings within the holder assemblies may be used to assist in aligning the wafer relative to the holder assemblies when the wafer is lifted. Holder assemblies 171, 173, and 175 are configured to fit into grooves 117d, 117e, and 117f. The grooves may have sloping side walls and/or bearings to assist in precisely positioning the holder assemblies as wafer indexing plate 104 is lowered to its resting position. Bearings used in conjunction with MOER ring 157 should be manufactured from a non-corrosive material such as sapphire. MOER ring 157 includes an exclusion lip 176 around the inside diameter that rests on or close to the top surface of wafer 156 during processing to prevent the reactive gases from contacting the outer diameter of wafer 156. For additional information on MOER rings as well as indexing wafers from one location within a chamber to another location see U.S. patent application Ser. No. 08/980,125, entitled "Method and Apparatus for Aligning Substrate to Chuck in Processing Chamber," filed on Nov. 6, 1997, and having the same assignee, which is incorporated herein by reference.

Figure 6:
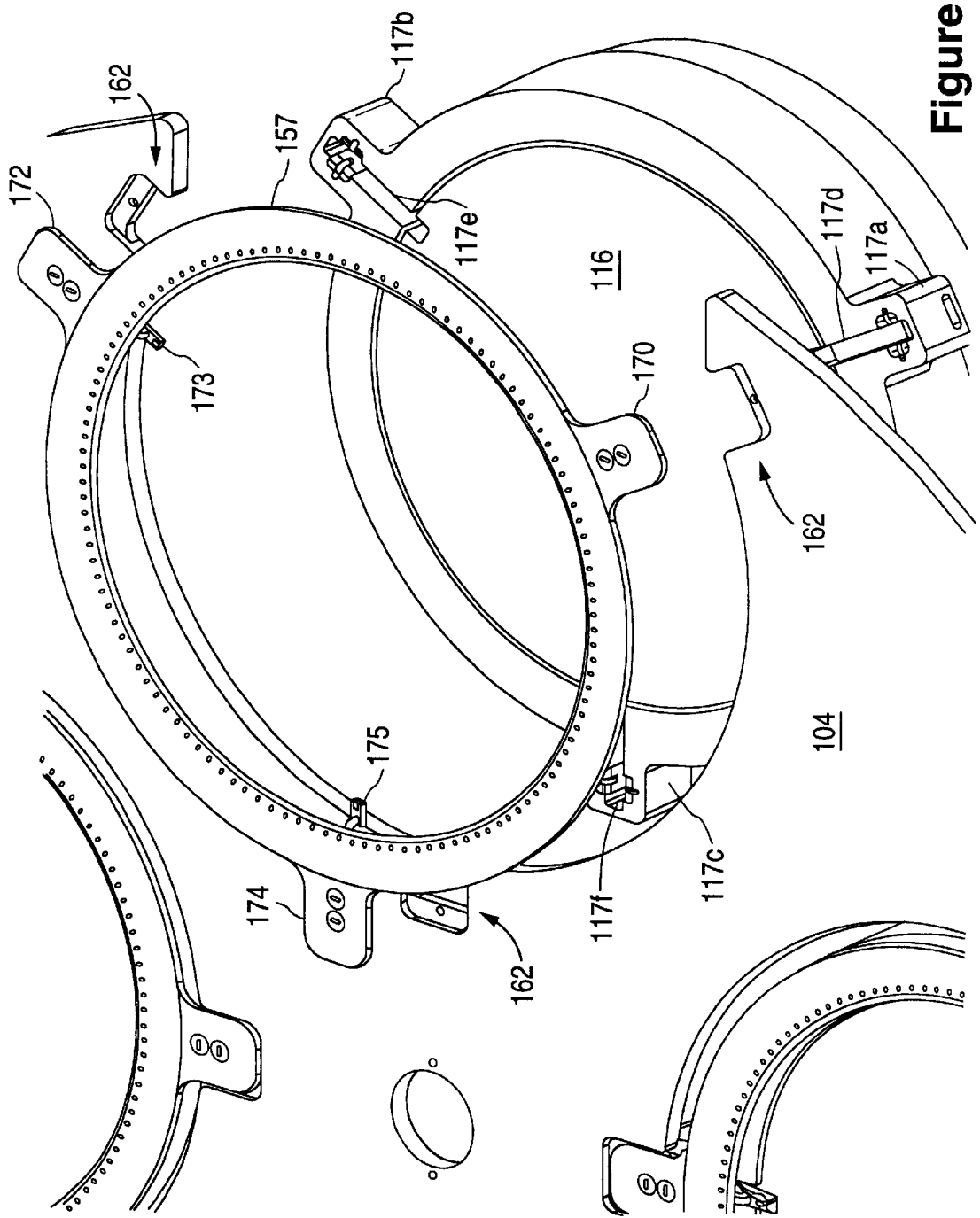
FIG. 6 is an exploded perspective view of a MOER ring, a wafer indexing plate, and a pedestal.
Figure 7:
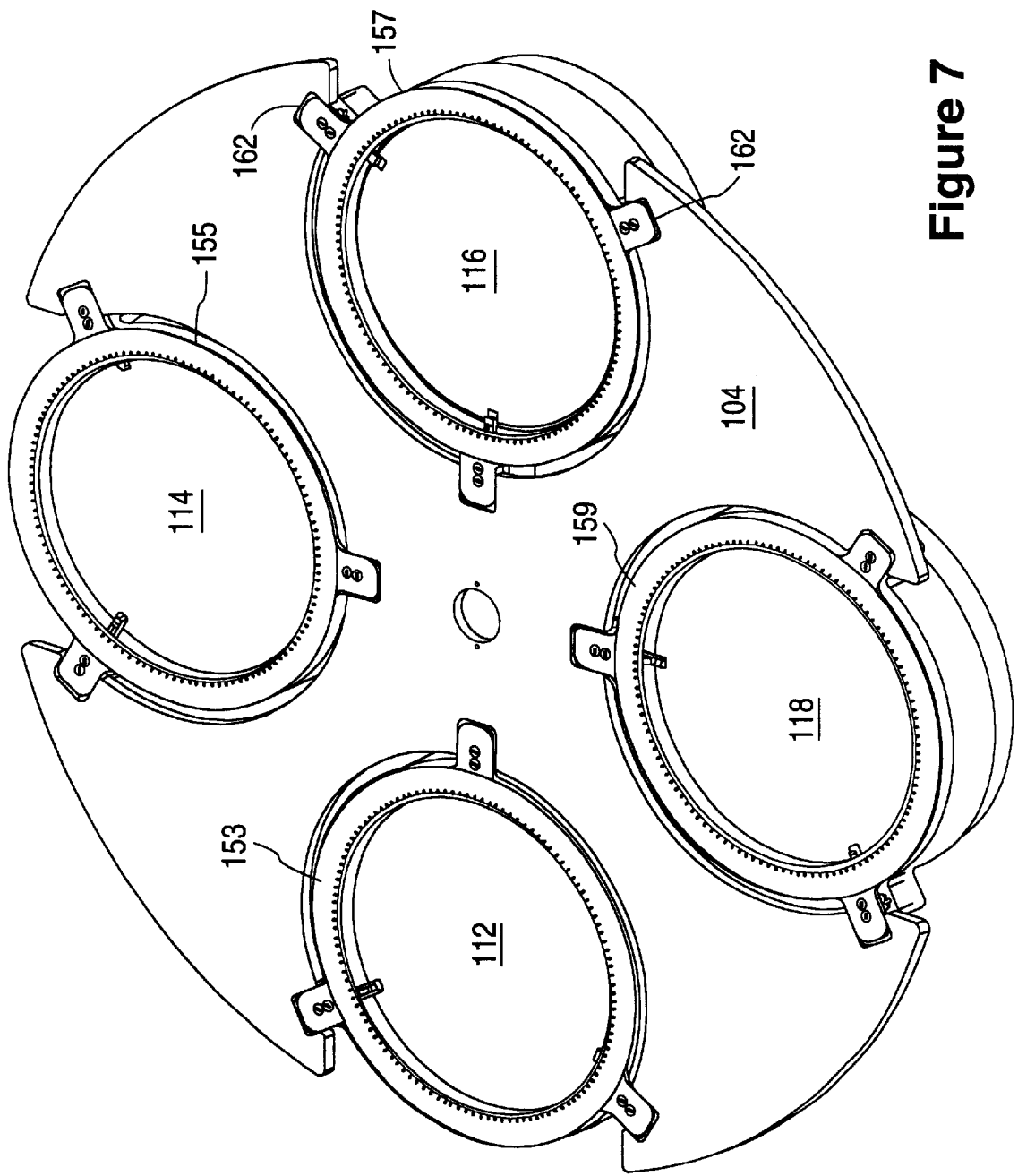
FIG. 7 is a perspective view of four MOER rings raised by a wafer indexing plate.

FIG. 6 is an exploded perspective view of MOER ring 157, wafer indexing plate 104, and pedestal 116. The tongues 170, 172, and 174 extend over mounting blocks 117a, 117b, and 117c, and fit into notches 162 on wafer indexing plate 104. As can be seen in FIG. 6, if desired, notches 162 may be configured to fit around mounting blocks 117a, 117b, and 117c. In addition, it can be seen in FIG. 6 that there are a plurality of MOER rings used. Thus, as shown in perspective view in FIG. 7, there is a separate MOER ring for each pedestal in chamber 100. FIG. 7 shows four MOER rings 157 raised by wafer indexing plate 104.

Figure 8A:
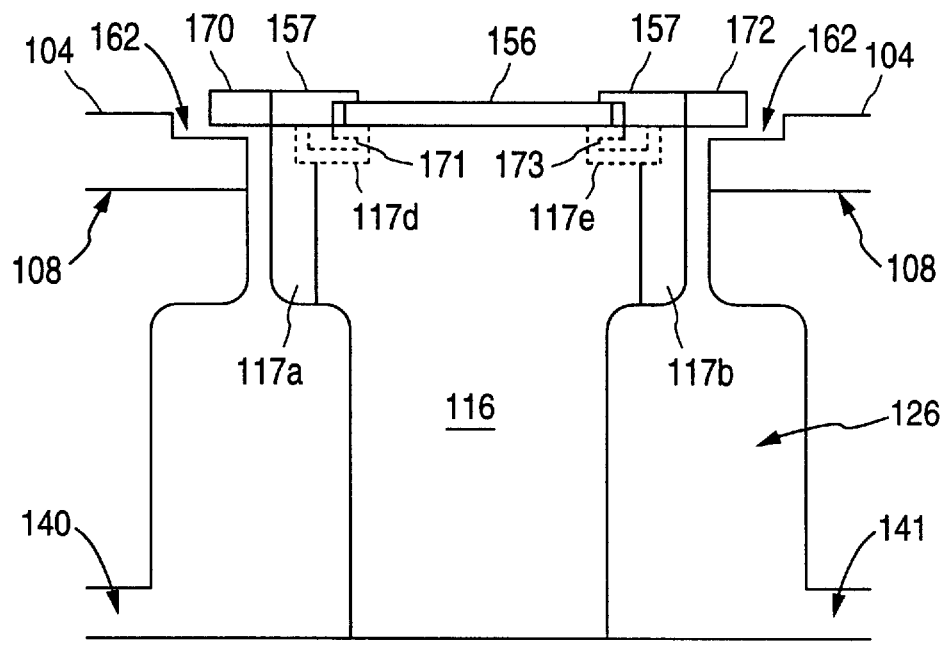
FIGS. 8A and 8B are side views of a pedestal and a well, illustrating the operation of the wafer indexing plate.
Figure 8B:
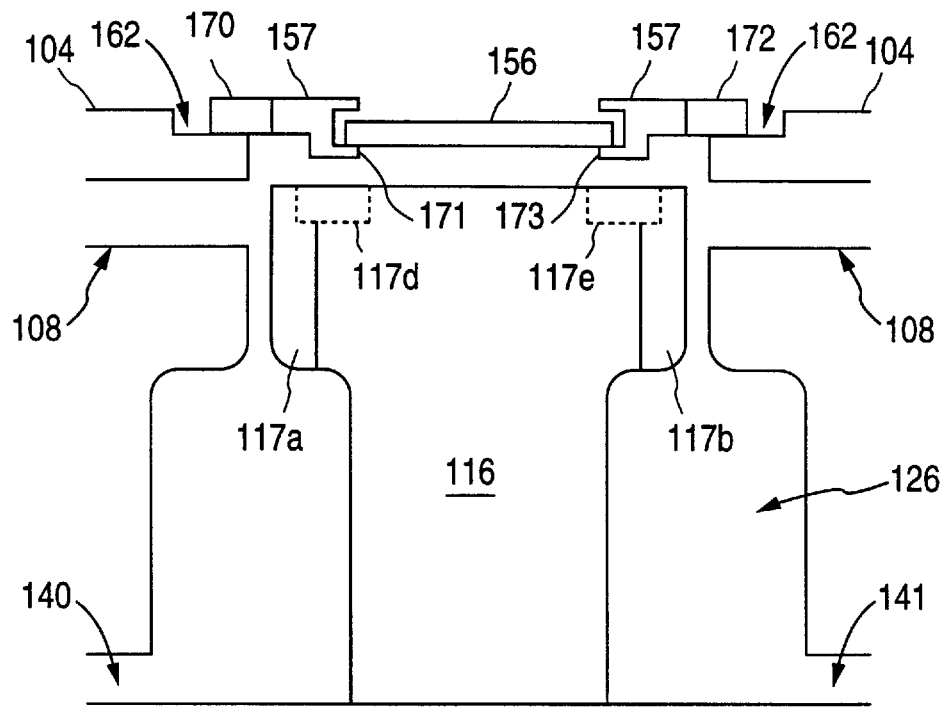

FIGS. 8A and 8B are side views of pedestal 116, with mounting blocks 117a and 117b with grooves 117d and 117e, and well 126, illustrating the operation of wafer indexing plate 104. FIGS. 8A and 8B also show exhaust port 140 along with exhaust port 141. Wafer 156 is vacuum clamped to pedestal 116. Alternatively, wafer 156 may be clamped to pedestal using an electrostatic charge, a mechanical clamp, or gravity. Vacuum chucks, electrostatic chucks, mechanical chucks, and other such type of chucks are well known to those of ordinary skill in the art. While wafer 156 is positioned on pedestal 116, wafer indexing plate 104 is resting on the top surface 108 of chamber base 102.

As shown in FIGS. 8A and 8B, MOER ring 157 includes tongues 170 and 172 with respective holder assemblies 171 and 173. Holder assemblies 171 and 173 are inserted into grooves 117d and 117e on pedestal 116 when wafer indexing plate 104 is resting on top surface 108. It should be understood that there is an additional tongue 174 and holder assembly 175 that is not shown in FIG. 8A for the sake of clarity. In addition, wafer indexing plate 104 includes a corresponding set of notches 162 for each tongue on MOER ring 157.

As illustrated in FIG. 8B, when wafer indexing plate 104 is lifted from its resting position by spindle 109 (shown in FIG. 1), tongues 170, 172 and 174 (shown in FIG. 6) of MOER ring 157 fit into notches 162 of wafer indexing plate 104. Thus, as wafer indexing plate 104 raises, MOER ring 157 is raised until holder assemblies 171, 173, and 175 (shown in FIG. 6) are lifted out of grooves 117d, 117e, and 117f (shown in FIG. 6). Thus, holder assemblies 171, 173, and 175 lift wafer 156 off the wafer bearing surface of pedestal 116. Wafer indexing plate 104 is then rotated until wafer 156 and MOER ring 157 are located over the next pedestal, i.e., pedestal 118 shown in FIG. 3. Wafer indexing plate 104 is then lowered so that holder assemblies 171, 173, and 175 are inserted into corresponding grooves in pedestal 118. The grooves in pedestal 118 aid in aligning holder assemblies 171, 173, and 175 such that wafer 156 and MOER ring 157 are precisely positioned on pedestal 118.

It should be understood that the use of wafer index plate 104, along with MOER rings with holder assemblies and grooves in the pedestal into which the holder assemblies are inserted is an example of one indexing system for the wafers in chamber 100. The present invention is not limited to one particular manner of moving the wafers from one position in chamber 100 to another position, nor is the present invention limited to the use of MOER rings. Thus, other indexing methods exist and may be used in conjunction with chamber 100 as will be understood by those of ordinary skill in the art. For example, where MOER ring 157 is not used, wafer 156 may be lifted by finger like extensions extending directly from wafer indexing plate 104. The finger-like extensions from wafer indexing plate 104 rest in grooves 117d, 117e, 117f in pedestal 116 when wafer indexing plate 104 is in its lowered position.

Figure 9:
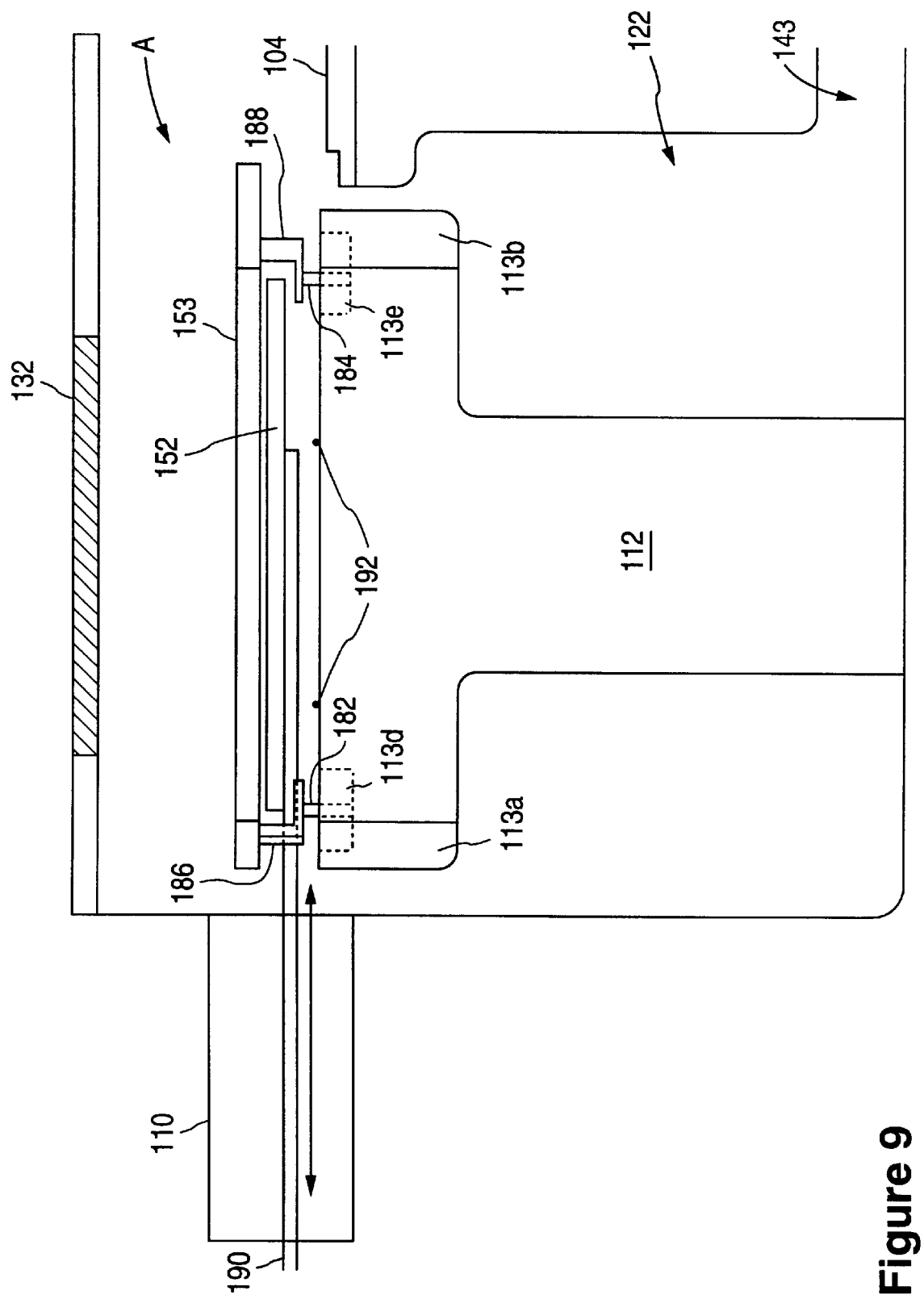
FIG. 9 shows a side view of station A, including a pedestal, a wafer indexing plate, and a load/unload port, illustrating the loading and unloading of a wafer from the chamber.

FIG. 9 shows a side view of station A, including pedestal 112, well 122, wafer indexing plate 104, showerhead 132, and load/unload port 110. FIG. 9 also shows pedestal 112 with mounting blocks 113a and 113b with respective grooves 113d and 113e. It should be understood that pedestal 112 includes an additional mounting block 113c and groove 113f that are not shown in FIG. 9. Exhaust port 143 is positioned between well 122 and well 128 (not shown).

FIG. 9 illustrates the loading and unloading of a wafer 152. As shown in FIG. 9, pedestal 112 includes a set of lift pins 182 and 184 that rise out of grooves 113d and 113e in pedestal 112 to lift MOER ring 153 via holder assemblies 186 and 188. Holder assembly 186 is shown as shorter than holder assembly 188 in FIG. 9 because of foreshortening. An additional lift pin (not shown) rises out of groove 113f (not shown) in pedestal 112 to lift a third holder assembly. Lift pins are used to lift MOER ring 153 in a controlled and stable manner. The use of lift pins may be controlled by controller 150, shown in FIG. 3. By lifting MOER ring 153, the wafer 152 is lifted by the holder assemblies of MOER ring 153.

To load a wafer, e.g., wafer 152, into chamber 100, wafer 152 is inserted through load/unload port 110 by a conventional mechanized robot arm 190, as illustrated by the arrow. Wafer 152 is inserted under MOER ring 153, but over the holder assemblies of MOER ring 153. Thus, the holder assemblies of the MOER rings used in conjunction with chamber 100 should be placed sufficiently apart that wafer 152 can pass between them. Robot arm 190 then lowers wafer 152 onto the extensions of the holder assemblies. Once wafer 152 is positioned on the holder assemblies of MOER ring 153, robot arm 190 is retracted through load/unload port 110 and chamber 100 is sealed. Lift pins 182 and 184 (as well as the lift pin not shown in FIG. 9) then lower MOER ring 153. Wafer indexing plate 104 is in a lowered position during this process.

Where preheating of wafer 152 is desired, the lift pins 182 and 184 are partially lowered and wafer 152 is supported above the wafer bearing surface of pedestal 112 by small springs 192 or a similar type of spacing mechanism, such as a second set of lift pins, to prevent contact between pedestal 112 and wafer 152. The separation between wafer 152 and pedestal 112 during preheating is approximately 0.014 inches. Once wafer 152 is preheated, wafer 152 may be lowered onto the wafer bearing surface of pedestal 112 by vacuum clamping wafer 152 downward to overcome the spring resistance of springs 192 or by lowering the second set lift pins. If desired, wafer 152 may be momentarily lifted via MOER ring 153 and lift pins 182 and 184 (as well as the lift pin not shown in FIG. 9) a second time to realign wafer 152 with respect to MOER ring 153 prior to clamping wafer 152 onto pedestal 112. Lift pins 182 and 184 are then completely lowered.

To unload a wafer, e.g., wafer 152, from chamber 100, wafer indexing plate 104 is rotated and then lowers wafer 152 onto pedestal 112 . Lift pins are raised to lift holder assemblies out of the grooves in pedestal 112, thereby lifting wafer 152 off the wafer bearing surface of pedestal 112. Mechanized robot arm 190 is inserted through load/unload port 110 until it is positioned under wafer 152. Robot arm 190 lifts wafer 152 off the holder assemblies and retracts wafer 152 through load/unload port 110. Another wafer may then be loaded into chamber 100 as described above.

Figure 10:
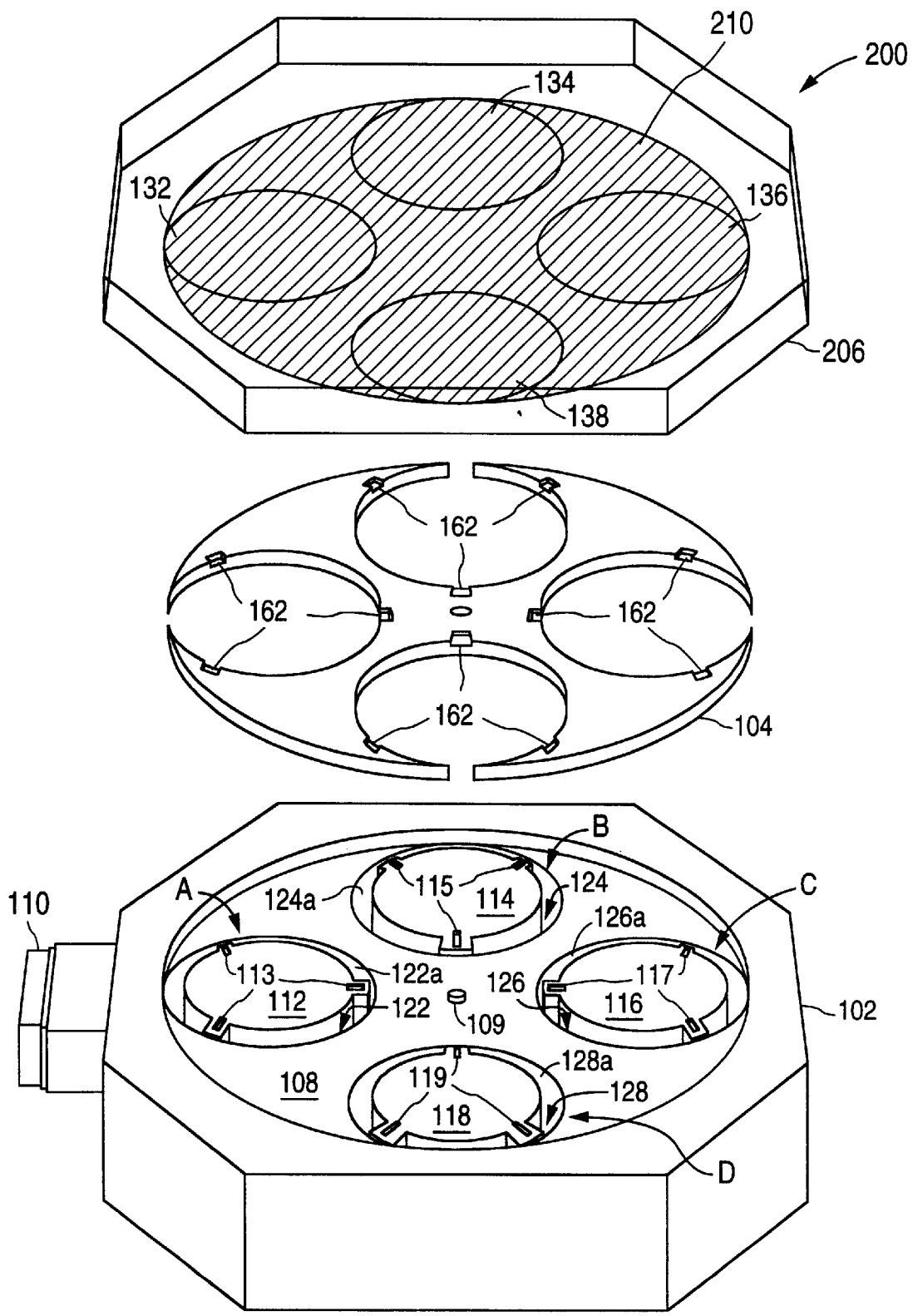
FIG. 10 is an exploded perspective view of another embodiment of the chamber in which a purge plate that delivers a uniform flow of an inert gas is located on the chamber top between stations A, B, C, and D.

FIG. 10 is an exploded perspective view of chamber 200, which is similar to chamber 100, like designated elements being the same. However, chamber top 206 includes a purge plate 210 that delivers a uniform flow of an inert gas, such as argon, between stations A, B, C, and D. The flow of inert gas is used to assist in maintaining separation of the reactive gases flowing at each station to isolate each station. Purge plate 210 has a diameter of 41 inches, i.e., the diameter of the interior of chamber 200, and has approximately 7344 holes each with a diameter of 0.063 inches.

Figure 11:
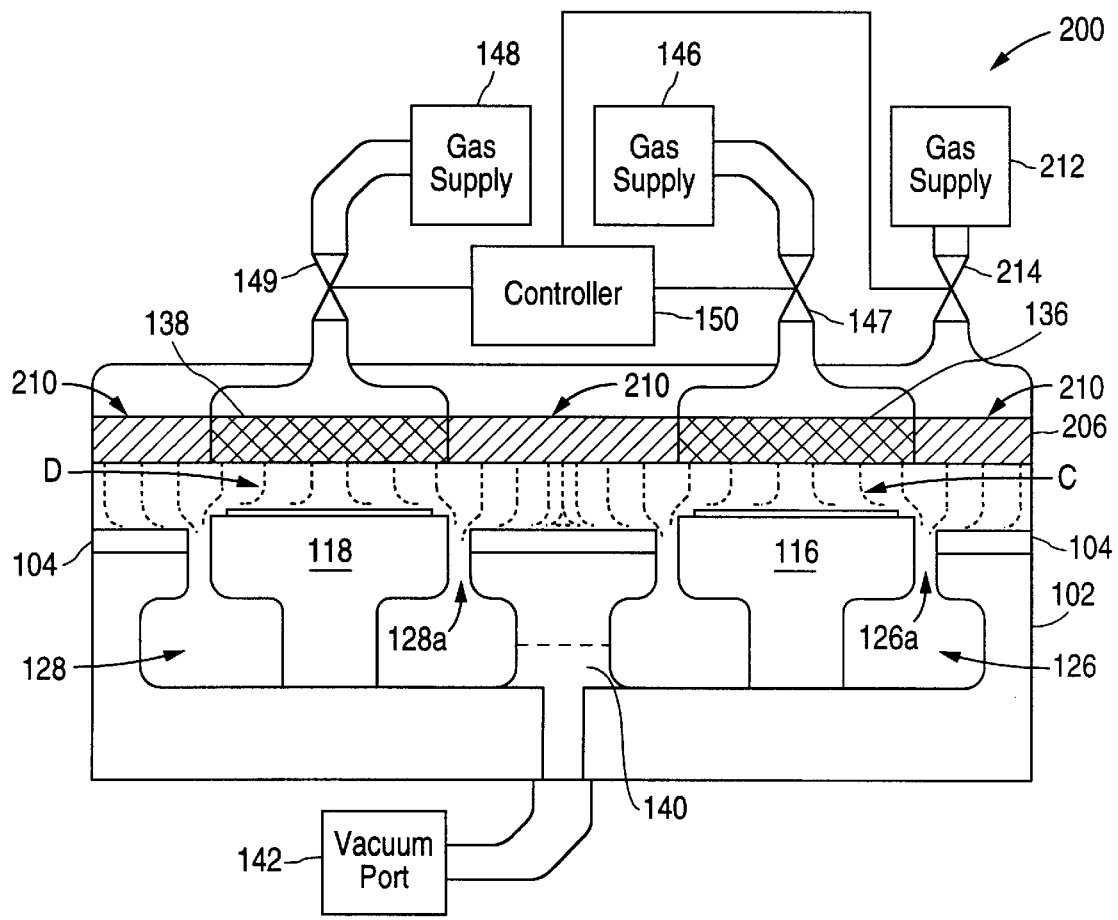
FIG. 11 is a cross-sectional view of the chamber with the purge plate producing a flow of an inert gas.

FIG. 11 is a cross-sectional view of chamber 200 including chamber base 102, wafer indexing plate 104 and chamber top 206 with purge plate 210. FIG. 11 is similar to FIG. 3, like designated elements being the same. However, as shown in FIG. 11, chamber top 206 includes purge plate 210, which is connected to a gas supply 212 via a valve 214. Controller 150 controls the flow of gas from gas supply 212 to purge plate 210. Gas supply 212 contains an inert gas, for example argon. During processing, the inert gas flows through purge plate 210 between station C and D, as well as between the other stations of chamber 200, while the reactive gases flow through the showerheads above the pedestals. Vacuum pump 142 pumps the gas out of the wells, such that a pressure gradient is formed with the highest pressure being above the wafer bearing surfaces of the pedestals and the lowest pressure being in the wells. Thus, as shown in FIG. 11, the gases, including the reactive gases and the inert gas, are drawn into wells 126 and 128 through respective annular gaps 126a and 128 and out through exhaust port 140. The flow of reactive gases as well as inert gas is illustrated in FIG. 11 as broken lines.

To minimize dead space and to aid in the smooth flow of the gases, purge plate 210 should be flush with the showerheads of chamber 200, which will assist in reducing the residence time of the reactive gases.

By way of an example, the performance of chamber 100 will be described in terms of a tungsten deposition process. The deposition of tungsten is well understood by those of ordinary skill in the art. It will be understood that the described tungsten deposition process may be varied according to desired results and that other alternative processes may be used in accordance with other embodiments of the present invention. Further, the described process is intended to illustrate the isolation of incompatible processes within a multi-station chamber, in accordance with an embodiment of the present invention, and is not intended as an explanation of the tungsten deposition processes itself.

A process cycle in chamber 100 begins with wafers positioned in stations B, C, and D, and a wafer, i.e., wafer 152, being loaded into station A. As described above in reference to FIG. 9, wafer 152 is loaded into MOER ring 153 at station A above pedestal 112. Prior to clamping wafer 152 to pedestal 112, wafer 152 and MOER ring 153 are lowered such that wafer 152 is held slightly above the wafer bearing surface of pedestal 112, e.g., by springs 192 shown in FIG. 9, and wafer 152 is preheated for approximately ten seconds to 445° C. as described above in reference to FIG. 9. Wafer 152 is then vacuum clamped to pedestal 112 (MOER ring 153 is not clamped, but rests on the surface of pedestal 112 only by the force of gravity). If desired, lift pins can momentarily raise MOER ring 153 and wafer 152 so as to realign wafer 152 with MOER ring 153 prior to vacuum clamping wafer 152 to pedestal 112.

During the loading and unloading processes, as well as all the other processing steps, chamber 100 remains at same desired pressure, e.g., 40 torr. Because wafer indexing plate 104 is in a lowered position during the loading and preheating of wafer 152, the wafers at stations B, C, and D may be clamped and processing at stations B, C, and D may occur, prior to the wafer at station A being clamped. The combination of wafer 152 and MOER ring 153 will be described as wafer 152, unless otherwise indicated.

A silane ($SiH_4$) initiation is performed by feeding silane gas from showerhead 132 at 95 sccm (standard cubic centimeters per minute) over wafer 152 clamped to pedestal 112. Showerhead 132 also provides a flow of hydrogen ($H_2$) at 6400 sccm and argon at 5400 sccm with the silane gas flow. If desired, the silane initiation may occur while preheating wafer 152.

The wafers positioned at stations B, C, and D are clamped to respective pedestals 114, 116, and 118 and are simultaneously processed while wafer 152 is being pre-heated and clamped on pedestal 112 at station A and receives the silane initiation. of course, each of the wafers at stations B, C, and D have already received processing at each of the previous stations.

Once the silane initiation of wafer 152 at station A is complete or the process steps at stations B, C, or D are complete, whichever is longer, the reactive gases at each station are turned off. The reactive gases are permitted to drain out of chamber 100 via the exhaust ports. The non-reactive gases, e.g., the hydrogen and argon at stations A, B, C, and D, continue to flow while the reactive gases are drained out of chamber 100, thereby maintaining the desired isolating gas flow pattern, e.g., as shown in FIG. 3. If the wafers on pedestals 112, 114, 116, and 118 are indexed to the next stations prior to the reactive gases draining out of chamber 100, the reactive gases may combine in an undesirable manner resulting in contamination of the wafers. The amount of time necessary to permit the reactive gases to drain out of chamber 100 is dependent on the residence time of the reactive gases, but is typically five to ten seconds. Once the reactive gases have drained out, the vacuum clamps holding the wafers to the pedestals are turned off and wafer indexing plate 104 raises off top surface 108 lifting the MOER rings, which consequently lift the wafers off the pedestals. Wafer indexing plate 104 rotates to position the wafers in the next processing stations. Thus, wafer 152 is located in station B above pedestal 114.

After lowering wafer indexing plate 104 to position the wafers on the pedestals, the wafer that is now located at station A and which has finished the tungsten deposition process is raised via the lift pins and unloaded via load/unload port 110. A new unprocessed wafer is then loaded into station A, the lift pins are partially lowered and the new wafer is preheated. When the new wafer is preheated, the lift pins can be completely lowered thereby positioning the newly loaded wafer on pedestal 112. The new wafer at station A is then vacuum clamped.

Wafer 152, which is now clamped to pedestal 114 in station B receives silane and tungsten hexafluoride ($WF_6$) nucleation. Showerhead 134 feeds tungsten hexafluoride gas at 250 sccm and silane at 95 sccm along with a flow of hydrogen ($H_2$) at 5000 sccm and argon at 6400 sccm. The duration of the tungsten hexafluoride gas flow is dependent on the desired film thickness.

In some embodiments, for example, where a thin film is to be deposited on the wafers, the silane initiation process from station A is continued at station B. For the continued silane initiation process, showerhead 134 flows silane gas at 95 sccm along with hydrogen at 5000 sccm and argon at 6400 sccm. Using the continued silane initiation process at station B reduces the amount of time that wafer 152 must spend at station A. Consequently the amount of time a wafer spends at any one station is reduced, which produces a thinner film. After the silane initiation process at station B is complete, the tungsten hexafluoride-silane nucleation step is performed.

With the tungsten hexafluoride-silane nucleation step complete, as well as the respective process steps at the other stations, the showerheads in chamber 100 again shut off the reactive gases so that the reactive gases can drain out of chamber 100. The vacuum clamps are released, wafer indexing plate 104 raises and rotates to place the wafers in the next processing station. The wafers are then vacuum clamped. Thus, wafer 152 is now at station C vacuum clamped to pedestal 116. Again, the wafer at station A is unloaded and a new wafer is loaded and preheated.

A hydrogen ($H_2$) reduction of the tungsten hexafluoride occurs at station C. Showerhead 136 flows tungsten hexafluoride at 250 sccm along with a flow of hydrogen at 5000 sccm and argon at 4400 sccm. When the process steps at each of the respective stations have been completed, wafer 152 is moved to pedestal 118 at station D via wafer indexing plate 104 according to the same indexing process, including draining the reactive gases, lifting the wafers, rotating, and lowering the wafers. The process step at station D is the same as station C. Thus, showerhead 138 flows tungsten hexafluoride at 250 sccm along with a flow of hydrogen at 5000 sccm and argon at 4400 sccm. Wafer 152 completes the tungsten deposition process at station D.

Again at the appropriate time, the wafers are rotated to the next processing stations via wafer indexing plate 104. Thus, wafer 152, which has completed the tungsten deposition process, is located in station A. Wafer 152 is then unloaded via load/unload port 110, as described in reference to FIG. 9, thereby completing the process cycle.

It should be understood that with use of chamber 100, the deposition processes are divided into four equal time periods. The deposition process, however, includes several steps, such as preheating, silane initiation, tungsten hexafluoride-silane nucleation, and hydrogen reduction of tungsten hexafluoride, that do not have the same time requirements. Each process step is dependent on process parameters, such as desired temperature, flow rates, and desired film thickness. Thus, some stations in chamber 100 may perform only a portion of a process step while other stations perform multiple steps. However, because incompatible processes may occur simultaneously within chamber 100, the location and duration of each process step may be optimized, without concern to incompatible processes. Consequently, the throughput of multi-station processing chamber 100 is greater than conventional processing chambers. Of course, where a number of stations other than four is used in a multi-station processing chamber in accordance with an embodiment of the present invention, the processing steps must be proportionally divided into that number of stations.

In a conventional multi-station chamber system, the process steps at stations B, C, and D cannot occur simultaneously with the processing that occurs at station A. If the reactive gases of the tungsten deposition stations, e.g. tungsten hexafluoride, were to flow while silane is flowing, a commingling of the gases would lead to the detrimental formation of particles in the chamber. In addition, migration of the tungsten hexafluoride to station A prior to the silane initiation step can attack devices that are on the wafer. Consequently, in a conventional multi-station chamber, the incompatible gases must flow one at a time and therefore there is a period where the wafers must remain idle at their individual stations. Alternatively, the silane initiation step could be done in a separate reactor, but this adds cost and complexity to the system.

In chamber 100, however, the incompatible processes may be performed simultaneously because stations A, B, C, and D are isolated by the flow patterns of the gases. As shown in FIG. 3, the flow patterns of the reactive gases are directed through the annular gaps and into the wells where the gas is drained out the exhaust ports. Thus, chamber 100 limits the amount of crossover or commingling of the gases.

In another embodiment, shown in FIGS. 10 and 11, purge plate 210 is used to flow argon between the stations of chamber 100. During processing, purge plate 210 flows argon gas at 50 slm (standard liters per minute). Of course, other types of gases may also be used, such as hydrogen, although hydrogen is not truly inert. Hydrogen will reduce $WF_6$ to $W+HF$, but in the absence of $SiH_4+WF_6$, the hydrogen will not react and thus can be used. Purge plate 210 continues to flow argon throughout the deposition process, including during the rotation of wafer indexing plate 104 with the wafers. The use of an argon gas flow from purge plate 210 assists in directing the flow of the reactive gases down into the wells where the reactive gases are drained out. The reactive gases are thus directed away from neighboring stations and into the wells and exhaust ports, thereby preventing the tungsten hexafluoride at stations B, C, and D from crossing over to station A as well as preventing the silane gas at station A from crossing over to stations B, C, or D.

Although the present invention has been described in considerable detail with reference to certain versions thereof, other versions are possible. For example, the number of pedestals and stations used in the multi-station processing chamber may be varied according to the desired process. Further, the type of processing performed within the chamber is not limited to tungsten deposition, but may be any other process. The particular inert gas used to isolate the stations of the chamber is not limited to one particular gas, but may be any inert gas or combination of inert gases. Moreover, the specific configuration of chamber 100 may be varied to accommodate any desired number of isolated stations, pedestals, and/or processes. Therefore, the spirit and scope of the appended claims should not be limited to the description of the versions depicted in the figures.

What is claimed is:

1. A method of processing multiple substrates within a single chamber, said method comprising:

flowing a first gas supply over a second substrate at a first station within said chamber; and flowing a second gas supply over a first substrate at a second station within said chamber;

providing a separation between said first gas supply and said second gas supply by flowing said first gas supply over said second substrate and into a first annular gap around said second substrate and out an exhaust port, and by flowing said second gas supply over said first substrate into a second annular gap around said first substrate and out said exhaust port.

2. The method of claim 1 wherein said first substrate is loaded into said chamber at said first station and moved to said second station prior to said second substrate being loaded into said chamber at said first station.

3. The method of claim 1 further comprising:

moving said second substrate and said first substrate, whereby said second substrate is positioned at said second station; and flowing said second gas supply over said second substrate at said second station.

4. The method of claim 3, further comprising:

waiting for said first gas supply and said second gas supply to drain out of said chamber prior to moving said second substrate and said first substrate.

5. The method of claim 3 wherein moving said second substrate and said first substrate positions said first substrate at a third station within said chamber, said method further comprising:

flowing a third gas supply over said first substrate at said third station; and providing a separation between said third gas supply and said first gas supply and said second gas supply by flowing said third gas supply over said first substrate and into a third annular gap around said first substrate and out said exhaust port.

6. The method of claim 3 further comprising:

loading a third substrate into said chamber at said first station after moving said second substrate and said first substrate;

heating said third substrate;

flowing said first gas supply over said third substrate at said first station; and providing a separation between said first gas supply and said second gas supply by flowing said first gas supply over said third substrate and into said first annular gap around said third substrate and out said exhaust port, and by flowing said second gas supply over said second substrate into said second annular gap around said second substrate and out said exhaust port.

7. The method of claim 6, wherein said flow of a first gas supply at said first station is at least one of silane initiation, tungsten hexafluoride-silane nucleation and hydrogen reduction of tungsten hexafluoride.

8. The method of claim 6, wherein said flow of a second gas supply at said second station is at least one of silane initiation, tungsten hexafluoride-silane nucleation and hydrogen reduction of tungsten hexafluoride.

9. The method of claim 6, wherein said flow of a third gas supply at said third station is at least one of silane initiation, tungsten hexafluoride-silane nucleation and hydrogen reduction of tungsten hexafluoride.

10. The method of claim 6, said processing is tungsten deposition processing, and wherein said flow of a first gas supply at said first station is at least silane initiation, said flow of a second gas supply at said second station is at least a tungsten hexafluoride-silane nucleation, and said flow of a third gas supply at least said third station is a hydrogen reduction of tungsten hexafluoride.

11. The method of claim 10, further comprising a flow of said first gas supply at said second station as a continued silane initiation prior to flowing said second gas supply for tungsten hexafluoride-silane nucleation.

12. The method of claim 1, further comprising:
   flowing a purging gas supply between said first station and said second station;
   providing a separation between said first gas supply and said second gas supply by flowing said purging gas supply into said first annular gap and said second annular gap and out said exhaust port, said purging gas supply impedes said first gas supply and said second gas supply from combining.

13. The method of claim 12, wherein said first gas supply comprises a silane gas, said second gas supply comprises a tungsten hexafluoride gas, and said purging gas supply comprises an argon gas.

* * * * *